United States Patent
Tan et al.

(10) Patent No.: US 7,745,261 B2
(45) Date of Patent: Jun. 29, 2010

(54) CHIP SCALE PACKAGE FABRICATION METHODS

(75) Inventors: Xiaochun Tan, Shanghai (CN); Jun Guo, Shanghai (CN)

(73) Assignee: Shanghai KaiHong Technology Co., Ltd., Shanghai (CN)

( * ) Notice: Subject to any disclaimer, the term of this patent is extended or adjusted under 35 U.S.C. 154(b) by 89 days.

(21) Appl. No.: 12/109,597

(22) Filed: Apr. 25, 2008

(65) Prior Publication Data
US 2009/0215227 A1 Aug. 27, 2009

(30) Foreign Application Priority Data
Feb. 26, 2008 (CN) .................. 2008 1 0033896

(51) Int. Cl.
*H01L 21/00* (2006.01)
(52) U.S. Cl. .................. 438/113; 438/107; 438/110; 438/114; 438/118; 438/125; 438/126; 438/127
(58) Field of Classification Search .......... 438/106–127
See application file for complete search history.

(56) References Cited

U.S. PATENT DOCUMENTS

| | | | |
|---|---|---|---|
| 5,817,541 A | 10/1998 | Averkiou et al. | |
| 6,420,244 B2 | 7/2002 | Lee | |
| 6,732,913 B2 | 5/2004 | Alvarez | |
| 2003/0155641 A1 | 8/2003 | Yeo et al. | |
| 2006/0046436 A1* | 3/2006 | Ohuchi et al. | 438/460 |
| 2006/0081966 A1* | 4/2006 | Farnworth et al. | 257/632 |
| 2008/0014677 A1 | 1/2008 | Xiaochun et al. | |

* cited by examiner

*Primary Examiner*—N Drew Richards
*Assistant Examiner*—Jae Lee
(74) *Attorney, Agent, or Firm*—Fountainhead Law Group PC

(57) ABSTRACT

Embodiments of the present invention includes a method of assembling a chip scale package (CSP). The method comprises adding bumps, sawing the saw streets from the front of a wafer, molding the front of the wafer, grinding the back of the wafer, sawing the saw streets from the back of the wafer, molding the back of the wafer, and sawing between devices to form a plurality of packaged devices. Sawing the saw streets from the front of the wafer establishes a first cut. Molding the front of the wafer includes using a first mold compound such that the mold compound fills in the first cut. Sawing the saw streets from the back of the wafer establishes a second cut.

15 Claims, 3 Drawing Sheets

CHIP SCALE PACKAGE FABRICATION METHODS

CROSS REFERENCE TO RELATED APPLICATIONS

The present application claims priority to Chinese Patent Application No. 200810033896.8 filed Feb. 26, 2008 naming Xiaochun Tan and Jun Guo as inventors.

BACKGROUND

The present invention relates to semiconductor package assembly, and in particular, to chip scale package fabrication methods.

The continued demand for smaller electronic devices has encouraged development of smaller semiconductor packaging. Traditional semiconductor packages have used a metal lead frame which is used to give the semiconductor support and provide electrical connection to the printed circuit board outside the package. The size of the traditional package is limited by the size of the lead frame.

Chip scale packages (CSP) have been developed to allow for a smaller package outline and footprint. A CSP package does not have a lead frame like traditional semiconductor packages. Instead, metallization is added to the contact pads of the semiconductor die for contact and the portions around the chip may be covered with a mold compound. Therefore, the semiconductor chip package is on the order of size as the semiconductor die itself. The reduction of packaging size allows for higher integration of electronics and therefore enables more enhanced functions.

Present chip scale package fabrication methods require complicated processing techniques and expensive materials in order to manufacture such products. The current methods may not be cost-effective for all types of semiconductor devices. Many chip scale packages have portions of the semiconductor die exposed to the surrounding environment which may increase possible damage to the device due to handling or moisture, for example. The exposed portions may create long term reliability concerns.

Thus, there is a need for improved package fabrication methods. The present invention solves these and other problems by providing chip scale package fabrication methods.

SUMMARY

Embodiments of the present invention include a method of assembling a chip scale package (CSP). The method comprises adding conductive bumps, sawing along a plurality of saw streets from the front of a wafer, molding the front of the wafer, grinding the back of the wafer, sawing along the plurality of saw streets from the back of the wafer, molding the back of the wafer, and sawing between devices to form a plurality of packaged devices. Adding conductive bumps includes adding bumps to a plurality of contact locations on a front of a wafer having a plurality of devices. Sawing the saw streets from the front of the wafer establishes a first cut. Molding the front of the wafer includes using a first mold compound such that the mold compound fills in the first cut and covers the front side of the wafer leaving the bumps exposed. Grinding the back of the wafer and establishes a device width. Sawing the saw streets from the back of the wafer establishes a second cut. Molding the back of the wafer utilizes a second mold compound such that the mold compound fills in the second cut and covers the back of said wafer.

Additional embodiments will be evident from the following detailed description and accompanying drawings, which provide a better understanding of the nature and advantages of the present invention.

DETAILED DESCRIPTION

Described herein are techniques for performing chip scale package fabrication methods. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
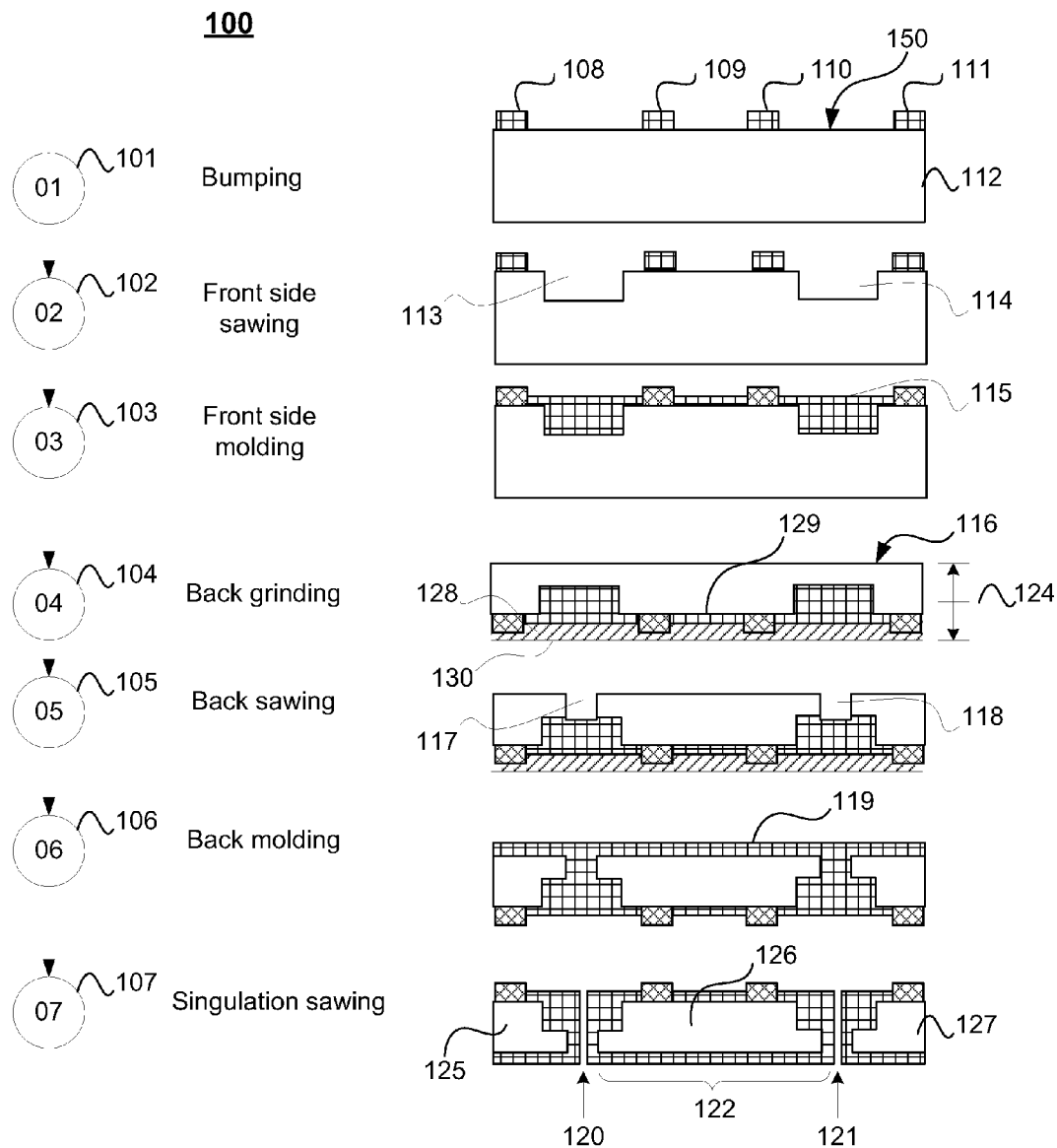
FIG. 1 illustrates a method of fabricating a chip scale package and the corresponding cut away side views according to one embodiment of the present invention.

FIG. 1 illustrates a method 100 of fabricating a chip scale package and the corresponding cut away side views according to one embodiment of the present invention. The method 100 includes the steps of bumping 101, front side sawing 102, front side molding 103, back grinding 104, back sawing 105, back molding 106, and singulation sawing 107.

The step of bumping 101 comprises adding conductive bumps (108, 109, 110, and 111) to a plurality of contact locations on the front 150 of a wafer 112. The wafer 112 may comprise a plurality of devices (125, 126, and 127). Each device (125, 126, and 127) may have a plurality of contact locations. These contacts may be the front metal layer of the semiconductor device and may be metalized pads which are specially shaped for adding a metalized bump. The front 150 of the wafer 112 may be the side that has been implanted with ions or diffused with dopants during the semiconductor fabrication process in which one of the last steps is to etch away a metal layer to form the contact locations. The bumps (108, 109, 110, and 111) may be formed using an electroplating process. The bumps (108, 109, 110, and 111) may be a metal alloy such as NiCo, NiCu, or NiAu, for example. The height of the bumps (108, 109, 110, and 111) may be high enough to make a reliable solder joint with a printed circuit board or substrate. This bump height may take into account other process steps such as the step of front side molding 103 which may influence the ability to make a reliable contact. A reliable contact may be a solder joint formed with the exposed bump and a printed circuit board footprint such that the solder joint does not crack, break, or otherwise open during standard reliability testing such as temperature cycling, for example. The thickness of the molding material may require additional bump height in order to protrude above the molding material. In one embodiment the bumps (108, 109, 110, and 111) may be greater than 30 microns, but in other implementations greater than 40 microns.

The step of front side sawing 102 cuts into the front side 150 of the wafer and makes a cut 113. A cut is a slit or notch made by a saw or some sort of cutting device. A cut has a height and a width. Another cut 114 is shown for clarity. The height of cut 113 may be much less than the overall height of the initial wafer thickness. Cut 113 may be made in the region between the devices such as within the saw street, for example. A saw street may be a region between individual devices which do not contain circuit elements. These regions are created to allow sawing of the wafer without destroying circuitry. A surface height control method may be used to maintain a more repeatable cut height across the wafer.

The step of front side molding 103 includes adding a mold compound 115 to the front 150 of the wafer 112 such that the mold compound fills in the cut 113 and covers the front side 150 of the wafer 112 leaving the bumps (108, 109, 110, 111) exposed. The molding compound forms a surface that should be planar and not have any obstructions protruding from the surface which may obstruct the bumps from making a reliable contact. For example, flashing around the region of the bumps may cause periodic contact problems. Flashing may be excess material which protrudes from the intended main body which has been molded. The flashing may be a remnant from the process of molding.

The step of back grinding 104 may include adding tape 128 to the front side of the wafer and grinding the back of the wafer 116. The tape 128 includes a first surface 129 and a second surface 130. The tape 128 allows the bumps to depress into the first surface 129 of the tape such that the second surface of the tape 130 remains planar. The planar surface allows for improved uniformity during the step of grinding 104, the step of back sawing 105, the step of back molding 106, or any combination thereof. The grinding of the back of the wafer removes a portion of the surface of the back of the wafer and establishes a die height 124.

The step of back sawing 105 may cut into the back of the wafer, establishing a cut 117. Another cut 118 is shown for clarity. Cut 117 may slightly cut into the area previously filled with molding compound. The back sawing 105 may be performed in the saw streets between the die. Cut 117 may be centered on cut 113. The step of back sawing 105 may include detecting cut 113 while the front and therefore cut 113 is not visible. The detection of cut 113 aids in aligning the wafer. Improved alignment may improve the step of back sawing 105 by improving manufacturing tolerances. For example, the wafer may be in a position with the back facing up and ready to be back grinded or back sawed. In this case, the surface elements are facing down and cannot be directly used to help align the wafer. In this case an infrared electromagnetic wave source may used to detect cut 113. Cut 113 may be more easily detected due to the abrupt change in thickness of the wafer material at the edge of the cut. A width of the cut 113 may be determined such that after the step of singulation sawing 107, the packaged part 122 retains an amount of molding compound on the sides that will provide protection of the semiconductor device 126.

The step of back molding 106 includes adding a mold compound 119 to the back of the wafer such that the mold compound fills in the second cut and covers the back of the wafer. The mold compound may meld with the mold compound within the first cut. This joins mold compound 115 and mold compound 119 together. Mold compound 115 may be composed of the same material as mold compound 119.

The step of singulation sawing 107 includes sawing through the wafer at locations (120, 121) between the devices (125, 126, and 127) such that a plurality of chip scale packages are formed. Packaged device 122 is an example of one of the plurality of chip scale packages.

Figure 2:
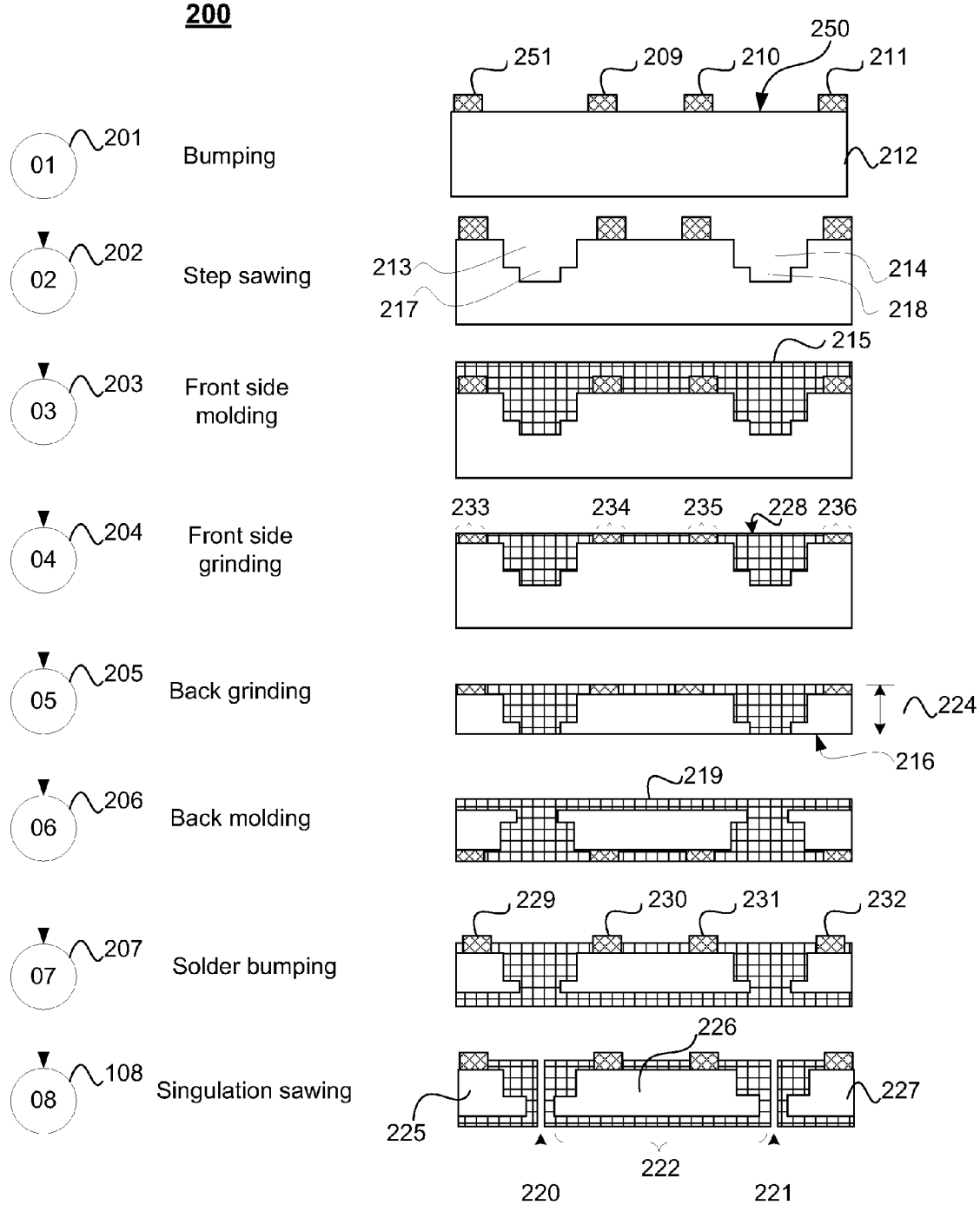
FIG. 2 illustrates another method of fabricating a chip scale package and the corresponding cut away side views according to one embodiment of the present invention.

FIG. 2 illustrates another method of fabricating a chip scale package and the corresponding cut away side views according to one embodiment of the present invention. The method includes the steps of bumping 201, step sawing 202, front side molding 203, front side grinding 204, back grinding 205, back molding 106, bumping 207, and singulation sawing 208.

The step of bumping 201 is similar to that discussed in step 101 of method 100. The bumps (251, 209, 210, and 211) are added to the front side 250 of the wafer 212.

The step of step sawing 202 includes 2 cuts into the front side of the wafer. One sawing makes a cut 213. Another cut 214 is shown for clarity. A height of cut 213 may be less than the overall height of the initial wafer thickness. Cut 213 may be made in the region between the devices such as a saw street, for example. Another sawing makes a cut 217. Another cut 218 is shown for clarity. The width of cut 217 may be narrower than the width of cut 213. The height and the width of the cut 217 (as measured from the bottom of the first cut) create a ledge or step. The step prevents the die from slipping within the final molded package. A surface height control method may be used to maintain a more repeatable cut height across the wafer.

The step of front side molding 203 includes adding a mold compound 215 to the front 250 of the wafer 212 such that the mold compound 215 fills in cut 213 and cut 217 and covers the front 250 of the wafer 212 including the bumps (251, 209, 210, and 211).

The step of front side grinding 204 removes a portion of the surface of the front side of the wafer 228 including a layer of mold compound and a portion of the bumps (251, 209, 210, and 211). The step of front side grinding 204 results in exposed conductive sites (233, 234, 235, and 236).

The step of back grinding 205 removes a portion of the back of the wafer 216 and establishes a die height 224. The step of back grinding 205 also exposes the molding material located within cut 217.

The step of back molding 206 includes adhering a mold compound 219 to the back of the wafer such that the mold compound 219 covers the back of the wafer. The mold compound may meld with the mold compound within the exposed cut 217.

The step of bumping 207 includes adding additional bumps to the conductive sites (233, 234, 235, and 236) created after the back grinding step 205. These additional bumps may include SnCuAg which may bond with a NiCo from the step of bumping 201 to form an alloy, for example. In other embodiments the additional bumps may be comprised of other compositions including tin (Sn). The additional bumps may be applied to the surface of the conductive sites (233, 234, 235, and 236) using a printing process. The conductive sites may be utilized to align the wafer prior to adding the additional bumps. This may improve manufacturing tolerances.

The step of singulation sawing 208 is similar to that discussed in step 107 of method 100. Reference numbers 120, 121, 122, 125, 126, and 127 of FIG. 1 correspond to reference numbers 220, 221, 222, 225, 226, and 227 of FIG. 2 respectively. The additional bumps (233, 234, 235, and 236) may be utilized to align the wafer prior to the step of singulation sawing 208.

Figure 3:
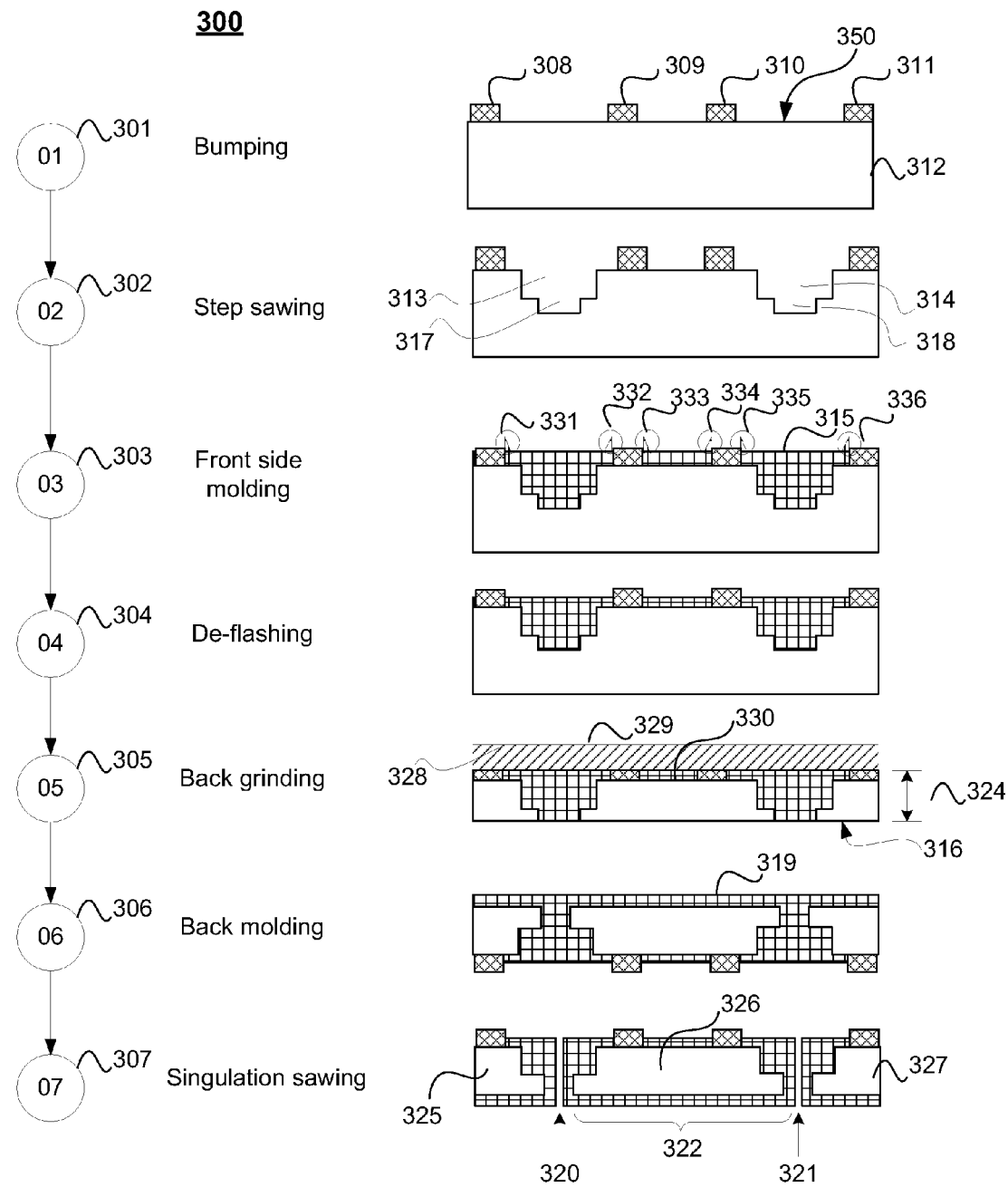
FIG. 3 illustrates another method of fabricating a chip scale package and the corresponding cut away side views according to one embodiment of the present invention.

FIG. 3 illustrates another method 300 of fabricating a chip scale package and the corresponding cut away side views according to one embodiment of the present invention. The method includes the steps of bumping 301, step sawing 302, front side molding 303, de-flashing 304, back grinding 305, back molding 306, and singulation sawing 307.

The step of bumping 301 is similar to that discussed in step 101 of method 100. The bumps (308, 309, 310, and 311) are added to the front side 350 of the wafer 312.

The step of step sawing 302 is similar to that discussed in step 202 of method 200. One sawing results in a first cut (313, 314) and another sawing results in a second cut (317, 318) as described above.

The step of front side molding 303 includes adhering a mold compound 315 to the front of the wafer such that the mold compound fills in the first and second cut and covers the front side of the wafer leaving the bumps (308, 309, 310, and 311) exposed.

The step of de-flashing 304 removes an excess of mold compound protruding around the bumps which may interfere with making electrical contact in the final package. Locations 331, 332, 333, 334, 335, and 336 contain portions of mold compound which would be removed during the step of de-flashing 304. The de-flashing 304 may be a mechanical process, a chemical process, or a combination of processes. The de-flashing 304 may be performed utilizing a laser. The bumps (308, 309, 310, and 311) may be utilized to align the wafer prior to any processing.

The step of back grinding 305 is similar to that discussed in the step 104 of method 100. The tape 328 includes a first surface 329 and a second surface 330, and functions as previously described. Also as previously described, the grinding of the back of the wafer 316 establishes a die height 324.

The step of back molding 306 is similar to that discussed in step 206 of method 200. Reference number 219 of FIG. 2 corresponds to 319 of FIG. 3.

The step of singulation sawing 307 is similar to that discussed in step 107 of method 100. Reference numbers 120, 121, 122, 125, 126, and 127 of FIG. 1 correspond to reference numbers 320, 321, 322, 325, 326, and 327 of FIG. 3 respectively.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method of assembling a chip scale package (CSP) comprising:
    adding conductive bumps to a plurality of contact locations on a front of a wafer having a plurality of devices;
    sawing along a plurality of saw streets from the front of said wafer and, in accordance therewith, establishing a first but;
    molding the front of said wafer with a first mold compound;
    grinding a back of said wafer and in accordance therewith establishing a device width;
    sawing along the plurality of saw streets and in accordance therewith establishing a second cut;
    molding the back of said wafer with a second mold compound, after establishing the second cut, such that the second mold compound covers the back of said wafer; and
    sawing between the devices, after molding the back of said wafer, to form a plurality of packaged devices.

2. The method of claim 1, wherein a tape has a first and a second surface, and grinding the back of said wafer includes:
    attaching the first surface of said tape to the front of said wafer,
    wherein said tape allows the bumps to depress into the first surface of the tape such that the second surface of the tape remains planar, and in accordance therewith allowing for improved uniformity during the step of grinding the back of said wafer.

3. The method of claim 1 wherein a width of the first cut is greater than a width of the second cut and in accordance therewith forming a ledge.

4. The method of claim 1 wherein the molding of the front of said wafer is done such that a resulting surface is planar in areas not containing bumps, and in accordance therewith allowing the bumps to make a reliable contact.

5. The method of claim 1 wherein the sawing along the plurality of saw streets includes:
    detecting the first cut of said wafer while the front of said wafer is not visible; and
    aligning the wafer according to said first cut, and in accordance therewith improving manufacturing tolerances,
    wherein the sawing of the second cut is done from the back of said wafer.

6. The method of claim 5 wherein the step of detecting includes exposing the wafer to electromagnetic radiation.

7. The method of claim 1 wherein molding the back includes the second mold compound filling in the second cut and melding with the first mold compound within the first cut.

8. The method of claim 1 wherein the first mold compound fills in the first cut and covers the front side of the wafer leaving the bumps exposed.

9. The method of claim 1 further comprising
    grinding the front of said wafer to remove a layer of the first mold compound and expose the first conductive bumps such that a second plurality of conductive locations are formed; and
    adding a set of second conductive bumps to the second plurality of conductive locations.

10. The method of claim 9 wherein a solder joint provides contact between at least one of the second conductive bumps and a metalized footprint on a printed circuit board.

11. The method of claim 1 wherein the sawing of the second cut is done from the front of said wafer.

12. The method of claim 1 wherein molding the front of said wafer with a first mold compound includes filling in the first cut and the second cut with the first mold compound.

13. The method of claim 12 wherein the grinding of the back of said wafer exposes the first mold compound from the back side.

14. The method of claim 12 wherein molding the front of said wafer with the first mold compound further includes covering the front side of said wafer with the first mold compound while leaving a portion of said conductive bumps exposed.

15. The method of claim 1 further comprising removing an excess of mold compound around the plurality of contact locations after said molding the front of said wafer with said first mold compound.

* * * * *